United States Patent
Wang

(10) Patent No.: US 6,262,481 B1
(45) Date of Patent: Jul. 17, 2001

(54) FOLDED HEAT SINK FOR SEMICONDUCTOR DEVICE PACKAGE

(75) Inventor: Bily Wang, Hsin-Chu (TW)

(73) Assignee: Harvatek Corporation, Hsin-Chu (TW)

( * ) Notice: Subject to any disclaimer, the term of this patent is extended or adjusted under 35 U.S.C. 154(b) by 0 days.

(21) Appl. No.: 09/514,846

(22) Filed: Feb. 28, 2000

(51) Int. Cl.⁷ .............................. H01L 23/29; H05K 7/20; H05K 1/18
(52) U.S. Cl. .......................... 257/712; 257/713; 257/707; 257/680; 257/675; 257/703; 257/705; 257/700; 257/706
(58) Field of Search .................................. 252/706, 707, 252/712, 713, 717, 726, 675, 611, 705, 703, 700, 680

(56) References Cited

U.S. PATENT DOCUMENTS

| | | | |
|---|---|---|---|
| 5,309,322 | * 5/1994 | Wagner et al. | 257/675 |
| 5,357,056 | * 10/1994 | Nagano | 257/680 |
| 5,438,216 | * 8/1995 | Juskey et al. | 257/680 |
| 5,576,934 | * 11/1996 | Roethlingshoefer et al. | 361/761 |
| 5,612,576 | * 3/1997 | Wilson et al. | 257/788 |
| 5,729,432 | * 3/1998 | Shim et al. | 257/713 |
| 5,731,709 | * 3/1998 | Pasture et al. | 324/760 |
| 5,747,877 | * 5/1998 | Wilson | 257/703 |
| 5,923,084 | * 7/1999 | Inoue et al. | 257/712 |
| 5,962,917 | * 10/1999 | Moriyama | 257/693 |
| 6,011,691 | * 1/2000 | Schreffler | 257/780 |
| 6,013,948 | * 1/2000 | Akram et al. | 257/698 |
| 6,020,628 | * 2/2000 | Tower et al. | 257/680 |

* cited by examiner

Primary Examiner—Alexander O. Williams
(74) Attorney, Agent, or Firm—H. C. Lin Patent Agent

(57) ABSTRACT

A heat conducting metal is placed under a semiconductor chip and wraps around a substrate of the semiconductor device package to serve as the heat sink for the chip. The metal can wrap around a through-hole in the middle of the substrate, or wrap around the edge of the substrate. A metal plate can be placed between the chip and the heat conducting metal to hold the semiconductor chip.

6 Claims, 5 Drawing Sheets

FOLDED HEAT SINK FOR SEMICONDUCTOR DEVICE PACKAGE

BACKGROUND OF THE INVENTION

(1) Field of the Invention

This invention relates to semiconductor device package, in particular to the heat sink of the package.

(2) Description of the Related Art

As semiconductor technology progresses, the semiconductor chip becomes smaller and smaller, the integrated circuit becomes denser and denser, and the chip generates more and more heat.

FIG. 1 shows the top view of a prior art package. FIG. 2 shows the side view of FIG. 1. A semiconductor chip 10 is mounted on a heat conducting metal layer 12 over a substrate 14. The heat conducting metal 12 conducts away the heat generated from the chip 10.

Such a conventional packaging technique is inadequate to accommodate the high heat dissipation of modern high density integrated circuit. A low thermal impedance is needed to prevent the chip to reach an excessive temperature.

Take a light emitting semiconductor chip for instance. The high brightness requirement of the chip dictates that the chip generates a great deal of heat. This heat must be removed to prevent any damage to the chip. Therefore, the ability to remove the heat is directly related to the brightness which the chip can attain. Therefore, the thermal impedance is directly related to the ability to achieve brightness. Such is the goal pursued by the semiconductor industry.

SUMMARY OF THE INVENTION

The object of this invention is to provide a semiconductor device package with low thermal impedance in preventing a high operating temperature of the semiconductor device. Another object of the invention is to provide heat sink without increasing the volume of the package. Still another object of the invention is to achieve high brightness of a light emitting device.

These objects are achieved by adding cooling fins within the confines of the package. The fins wrap around the substrate upon which a semiconductor chip is mounted. The fins can wrap around a hole in the middle of the substrate, or the edges of the substrate. A heat conducting metal plate can be placed between the chip and the fins to hold the chip when the chip is smaller than the through-hole.

DETAILED DESCRIPTION OF THE INVENTION

Figure 1:
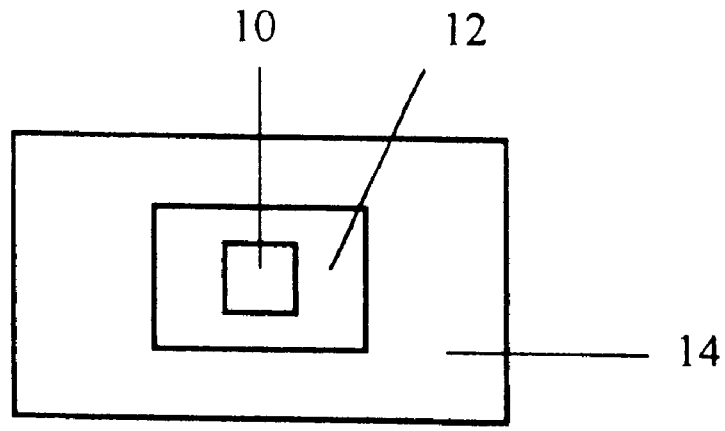
FIG. 1 shows the top view a prior art semiconductor device package.
Figure 2:
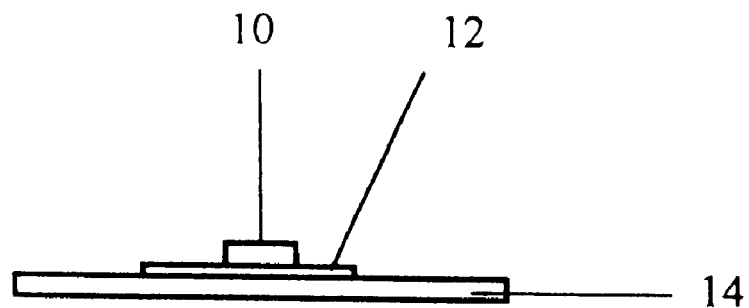
FIG. 2 shows the side view of FIG. 1.
Figure 3:
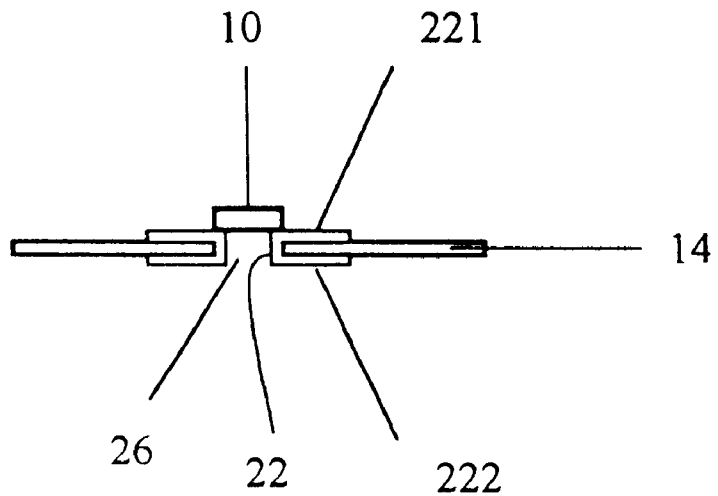
FIG. 3 shows the side view of a semiconductor device package based on the present invention.

FIG. 3 shows the first embodiment of the present invention. A semiconductor chip 10 is mounted on a substrate 14, which has a through hole 26. The through hole 26 is lined with a heat conducting material 22. The conducting material 22 has a heating conducting flange 221 on top where the chip 10 makes contact and another heating conducting flange 222 at the bottom. The flanges wrap around the through-hole 26. The heat generated by the chip 10 is conducted by the top flange 221 through the lining 22 to the bottom flange 222, which has a large area to radiate the heat.

Figure 4:
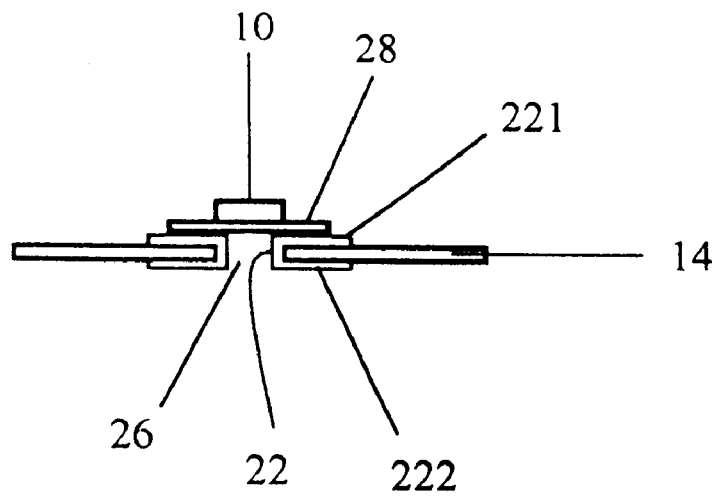
FIG. 4 shows a second embodiment of the present invention.

FIG. 4 shows a second embodiment of the present invention. When the chip size 10 is very small comparable to the size of the through hole 26, the contact area between the chip may be too small for the heat to be conducted away. In such a case a heat conducting plate 28 is placed underneath the chip to form a bridge for the top flange 221. The dimension of the plate 28 is larger than the dimension of the through-hole 26. The conducting plate 28 allows a larger area to contact the top flange 221, allowing more heat to be removed. When the chip 10 is smaller than the through-hole, this design is more effective. Alternatively, the area of the top flange 221 can be enlarged to hold the chip 10 which may be smaller than the through-hole 26.

Figure 5:
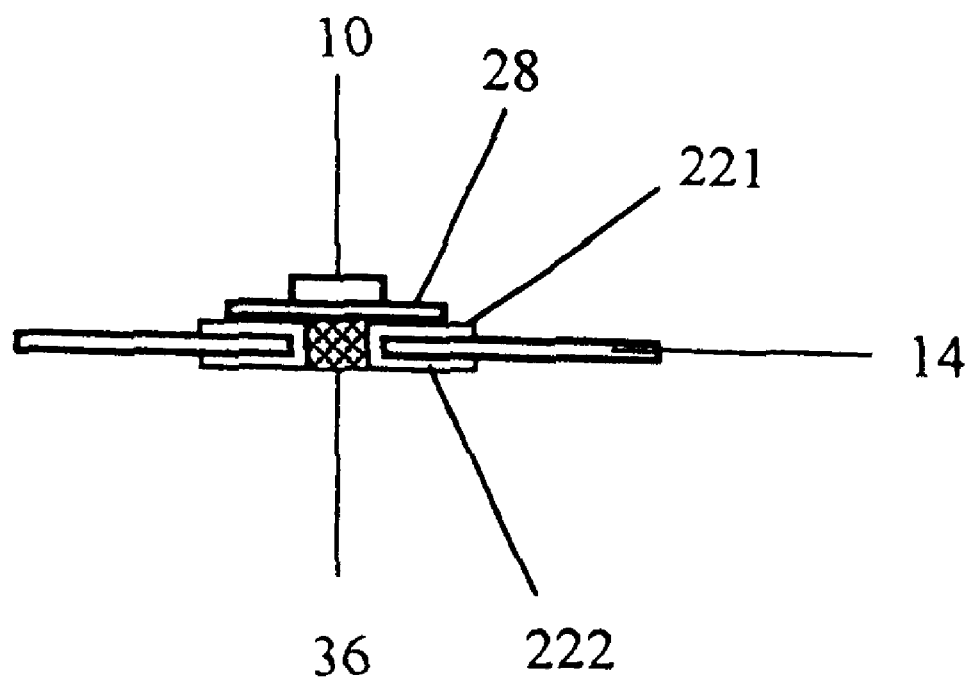
FIG. 5 shows a third embodiment of the present invention.

FIG. 5 shows a third embodiment of the present invention. The through-hole 26 is filled with heat conducting material 36 such as lead-tin alloy. The heat conducting filling 36 has a much lower thermal impedance than air. Thus filling 36 can enhance the heat conduction.

Figure 6:
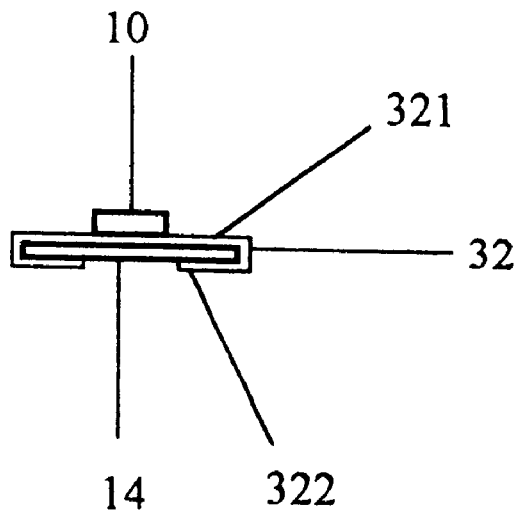
FIG. 6 shows a fourth embodiment of the present invention.

FIG. 6 shows a fourth embodiment of the present invention. No through-hole is used. Instead, a heat removal material 32 wraps over the outer edge of the substrate 14. The wrap has an upper surface 321, on which the chip 10 contacts, and a lower flange 322 encroaching the lower surface of the substrate 14. The extended surface of the wrap around metal 32 enhances the radiation of heat from the chip 10 and forms a heat sink for the chip 10.

Figure 7:
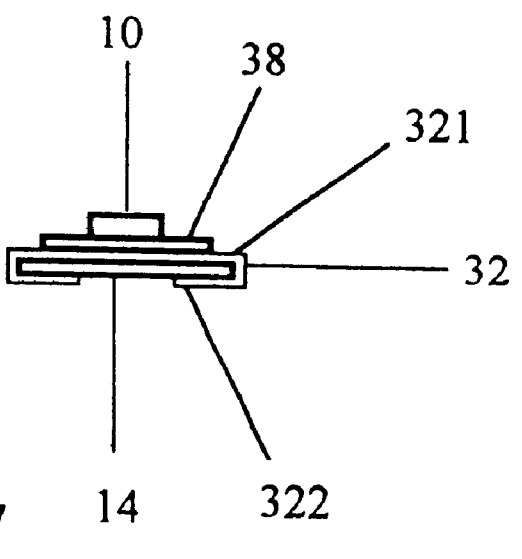
FIG. 7 shows a fifth embodiment of the present invention.

FIG. 7 shows a fifth embodiment of the present invention. A heat conducting metal plate 38 is placed between the chip 10 and the wrap-around heat sink 321, 32 and 322. The metal plate 38 elevates the chip 10 and increases the heat radiating surface. Thus the thermal impedance can be reduced and speed up cooling.

Figure 8:
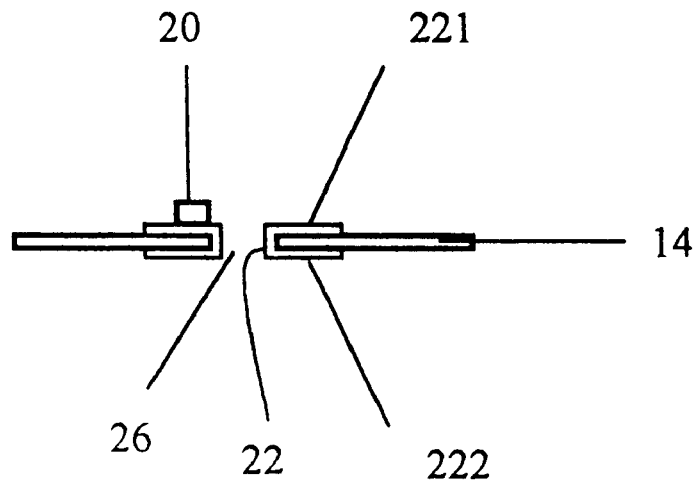
FIG. 8 shows a modification of FIG. 3.

FIG. 8 shows another method of mounting a chip smaller than the through-hole 26 with heating conducting lining 22, top flange 221 and bottom flange 222 folding around the substrate 14 as shown in FIG. 3. In FIG. 8, the smaller chip 20 is mounted on the flange 221 instead of bridging over through-hole.

Figure 9:
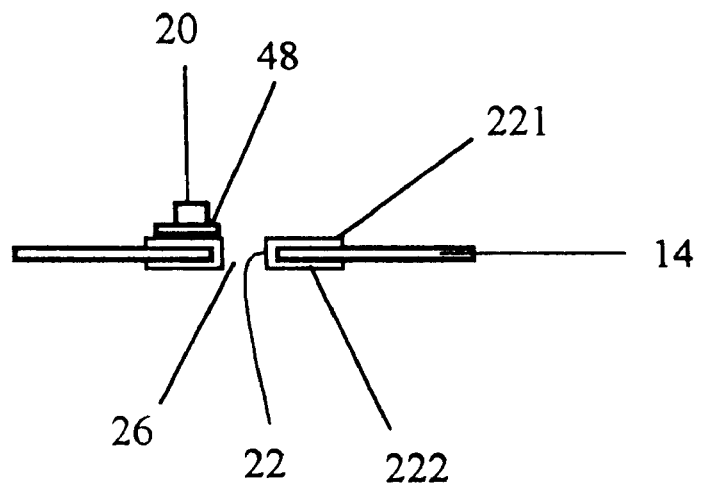
FIG. 9 shows a modification of FIG. 8.

FIG. 9 shows another variation of FIG. 8. A heat conducting plate 48 is placed between the chip 20 and the top flange 221. The heat conducting plate 48 increases the cooling area, thereby reducing the thermal resistance of the chip 20.

From the foregoing descriptions, it can be seen that the present invention uses a folded heat sink to remove heat without enlarging the area of the package, while most conventional semiconductor packages uses enlarged fins as heat sink.

While the preferred embodiments of the invention have been described, it will be apparent to those skilled in the art that various modifications may be made in the embodiments without departing from the spirit of the present invention. Such modifications are all within the scope of this invention.

What is claimed is:

1. A semiconductor device package, comprising:
   a semiconductor chip;
   a substrate for said semiconductor chip;
   a heat conducting metal, wrapping around said substrate to form a heat sink for said semiconductor chip;
   a through-hole in said substrate, around which said heat conducting metal wraps, and over which said semiconductor chip lies; and
   a heat conducting plate between said semiconductor chip and said heat conducting metal.

2. A semiconductor device package comprising:
   a semiconductor chip;
   a substrate for said semiconductor chip;
   a heat conducting metal, wrapping around said substrate to form a heat sink for said semiconductor chip;
   a through-hole in said substrate, around which said heat conducting metal wraps, and over which said semiconductor chip lies, wherein said semiconductor chip lies away from through-hole; and
   a heat conducting plate between said semiconductor chip and said substrate.

3. A semiconductor device package as described in claim 1, wherein said semiconductor chip is smaller than said through-hole.

4. A semiconductor device package as described in claim 1, further comprising a heat conducting filling for said through-hole.

5. A semiconductor device package as described in claim 4, wherein said filling is a lead-tin alloy.

6. A semiconductor device package comprising:
   a semiconductor chip;
   a substrate for said semiconductor chip;
   a heat conducting metal, wrapping over the edge of said substrate to form a heat sink for said semiconductor chip;
   a through-hole in said substrate, around which said heat conducting metal wraps, and over which said semiconductor chip lies; and
   a heat conducting plate between said semiconductor chip and said heat conducting metal.

* * * * *